United States Patent
Rissing et al.

(10) Patent No.: US 7,223,921 B2
(45) Date of Patent: May 29, 2007

(54) COMPOSITE COMPRISED OF FLAT CONDUCTOR ELEMENTS

(75) Inventors: Lutz Rissing, Seebruck (DE); Peter Fischer, Rimsting (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 249 days.

(21) Appl. No.: 10/471,464

(22) PCT Filed: Feb. 14, 2002

(86) PCT No.: PCT/EP02/01590

§ 371 (c)(1),
(2), (4) Date: Feb. 20, 2004

(87) PCT Pub. No.: WO02/076159

PCT Pub. Date: Sep. 26, 2002

(65) Prior Publication Data

US 2004/0134684 A1    Jul. 15, 2004

(30) Foreign Application Priority Data

Mar. 9, 2001    (DE) ................. 101 11 389

(51) Int. Cl.
*H05K 1/00*    (2006.01)
(52) U.S. Cl. ............... 174/254; 174/255; 361/749
(58) Field of Classification Search ........ 174/254–260; 361/783–789, 749
See application file for complete search history.

(56) References Cited

U.S. PATENT DOCUMENTS

| | | | |
|---|---|---|---|
| 3,770,874 A | | 11/1973 | Krieger et al. |
| 4,842,373 A | | 6/1989 | Tomofuji et al. |
| 4,950,527 A | * | 8/1990 | Yamada ................ 428/192 |
| 5,192,835 A | * | 3/1993 | Bull et al. ............ 174/260 |
| 5,418,691 A | * | 5/1995 | Tokura ................. 361/803 |
| 5,453,582 A | | 9/1995 | Amano et al. |
| 5,815,919 A | | 10/1998 | Nakanishi et al. |
| 6,225,206 B1 | * | 5/2001 | Jimarez et al. ........ 438/616 |

FOREIGN PATENT DOCUMENTS

| | | |
|---|---|---|
| DE | 2 044 494 | 1/1972 |
| DE | 38 12 922 C2 | 5/1989 |

(Continued)

OTHER PUBLICATIONS

Patent Abstracts of Japan Abstract regarding Japanese Publication No. 60-238714, published by Japanese Patent Office, vol. 10, No. 106 (P-449), Apr. 22, 1986, one page.

(Continued)

*Primary Examiner*—Tuan Dinh
(74) *Attorney, Agent, or Firm*—Brinks Hofer Gilson & Lione

(57) ABSTRACT

A composite of at least two flat elements that includes a first support substrate having a first solder pad, and a second support substrate having a second solder pad that is soldered together with the first solder pad. Strip conductor structures are applied to the first support substrate and the second support substrate and a link area that connects a solder shunting area with the first solder pad, wherein the link area is narrower than the first solder pad and the solder shunting area.

8 Claims, 3 Drawing Sheets

FOREIGN PATENT DOCUMENTS

| | | |
|---|---|---|
| DE | 42 32 634 A1 | 3/1994 |
| DE | 43 37 111 A1 | 9/1994 |
| DE | 295 17 067 U1 | 1/1996 |
| EP | 0 696 159 A1 | 2/1996 |
| EP | 1 026 927 A2 | 8/2000 |
| JP | 60-238714 A | 11/1985 |
| JP | 2-301725 A | 12/1990 |
| JP | 6-104547 A | 4/1994 |
| JP | 8-23148 A | 1/1996 |
| JP | 8-46338 A | 2/1996 |
| JP | 10-190202 A | 7/1998 |
| JP | 11-330661 | 11/1999 |

OTHER PUBLICATIONS

Patent Abstracts of Japan Abstract regarding Japanese Publication No. 2-301725, published by Japanese Patent Office, vol. 15, No. 84 (P-1172), Feb. 27, 1991, one page.

Patent Abstracts of Japan Abstract regarding Japanese Publication No. 6-104547, published by Japanese Patent Office, Vol. 18, No. 375 (E-1578), Jul. 14, 1994, one page.

Patent Abstracts of Japan Abstract regarding Japanese Publication No. 8-23148, published by Japanese Patent Office, vol. 1996, No. 5, May 31, 1996, five pages.

* cited by examiner

COMPOSITE COMPRISED OF FLAT CONDUCTOR ELEMENTS

Applicants claim, under 35 U.S.C. §§ 120 and 365, the benefit of priority of the filing date of Feb. 14, 2002 of a Patent Cooperation Treaty patent application, copy attached, Ser. No. PCT/EP02/01590, filed on the aforementioned date, the entire contents of which are incorporated herein by reference, wherein Patent Cooperation Treaty patent application Ser. No. PCT/EP02/01590 was not published under PCT Article 21(2) in English.

Applicants claim, under 35 U.S.C. § 119, the benefit of priority of the filing date of Mar. 9, 2001 of a German patent application, copy attached, Ser. No. 101 11 389.7, filed on the aforementioned date, the entire contents of each of which are incorporated herein by reference.

BACKGROUND OF THE INVENTION

1. Field of the Invention

The present invention relates to a composite of flat conducter elements having solder shunting areas. The present invention also relates to the use of this composite in sensor elements.

2. Description of the Related Art

The composite of flat conductor elements, for example of printed circuit boards or conductor foils, is employed in large numbers in many areas of electronics. In connection with sensor elements in particular it is quite often necessary to connect the actual sensor to the electronic evaluating device by such a composite. Often the sensor structures are embodied as strip conductors on printed circuit boards which can be made, for example, of glass. The connection with the electronic evaluating device then often is made via strip conductors on a flexible conductor foil. The printed circuit board and the conductor foil are then usually connected by a contact soldering method, in particular the smoothing solder method, in such a way that the respective strip conductors are in electrical contact with each other.

In order to satisfy the tendencies for miniaturization in the electronic field, the strip conductors, or the so-called solder pads, are arranged at continuously shrinking distances from each other. Solder pads are the areas in which the contact faces of the strip conductors of the respective solder partners are arranged. The smoothing solder method often is employed for contacting strip conductors arranged on two flat printed circuit boards, or conductor foils, as already mentioned above. In the course of this a solder deposit is placed on a solder pad of at least one of the two solder partners, wherein the volume of the solder deposit, i.e. the amount of solder, can naturally only be applied with limited accuracy within the range of definite tolerance values. Even with a galvanically applied solder deposit the actual volume of the solder deposit can fluctuate by up to 50%.

Depending on the type of application and technical realization capability, the solder deposit is often provided on only one of the solder partners. For achieving a high quality solder connection, the volume of the solder deposit must be applied, defined as accurately as possible, as a solder coating to the respective solder pad. After the solder deposit has been applied to the solder pads of at least one of the two solder partners, the two solder partners are placed on top of each other in exact positions. Thereafter, in accordance with the smoothing solder method, the solder depots are melted by a hot soldering plunger while the solder partners are pressed together. If now, because of process-related fluctuations, the volume of the applied solder is too large, the excess solder will exit the area of the solder pads, which can lead to the formation of short circuits between the strip conductors, so that the entire composite becomes unusable. Therefore the distances between the solder pads cannot be arbitrarily reduced.

Strip conductor arrangements are disclosed in Utility Model DE 295 17 067 U1, which have enlarged surfaces for receiving the excess solder.

The reduction of the distances between the strip conductors in such a composite is also limited in Utility Model DE 295 17 067 U1 because the shunting area for excess solder is arranged transversely to the strip conductors, i.e. in the direction of the distance which is to be minimized. Furthermore, in the embodiment of Utility Model DE 295 17 067 U1 the solder can spread unhampered transversely over the entire surface of the solder pad, even if the volume of the applied solder is relatively small within the tolerances, for example. In this case there is a tendency of too little solder material being available on the actual contact face.

SUMMARY AND OBJECTS OF THE INVENTION

Therefore an object of the present invention is based on providing a composite of flat elements supporting strip conductors, wherein the amount of the distance between the strip conductors can be minimized. Further than that it is intended to achieve sufficient protection against air bridges, even with short distances between the individual strip conductors, and to assure the good quality of the soldered connections.

This object is attained by a composite of at least two flat elements that includes a first support substrate having a first solder pad, and a second support substrate having a second solder pad that is soldered together with the first solder pad. Strip conductor structures are applied to the first support substrate and the second support substrate and a link area that connects a solder shunting area with the first solder pad, wherein the link area is narrower than the first solder pad and the solder shunting area.

It is intended in particular to employ the composite in accordance with the present invention in connection with sensor elements.

Accordingly, the present invention includes a composite of two flat elements consisting, for example, of a rigid and a flexible support substrate with associated conducting layers. Polyimide foils, small glass plates or fiberglass-reinforced epoxy resin plates can be considered as the support substrates for example. The conductor structures include for example of an approximately 20 µm thick copper layer applied to the electrically non-conducting support substrate. The conductor structures can be divided in accordance with their function and/or their design into several partial elements.

One of these partial elements is the solder pad already mentioned above, on which the contact faces for the soldered connection are provided. Usually the solder pads are comparatively wide. A further partial element is a strip conductor whose purpose essentially is the provision of an electrical connection between two functional areas on its support substrate. All structures on the support substrate can be functional areas, for example solder pads or sensor elements. The strip conductors are often the narrowest ones of the conductor structures. Besides the above mentioned two partial elements of the conductor structure, the composite in accordance with the present invention also has two more, namely the solder shunting area and a so-called link area. The solder shunting areas substantially have the function of receiving excess solder. The link areas provide the connection between the solder pads and the solder shunting areas.

The composite in accordance with the present invention is advantageously produced by the smoothing solder method, wherein the solder pad on which the solder deposit is placed prior to the actual soldering process is preferably smaller than the one located opposite it. In an optimally produced soldering process, the smaller solder pad corresponds at the same time to the contact area of the soldered connection. The solder shunting area can be arranged on the support substrate with the pre-soldered solder pad, as well as on the opposite support substrate. However, it is practical if the solder shunting area is arranged on the support substrate to which no solder deposit had been applied prior to the soldering process. The link areas can also be embodied as desired on one of the two support substrates. The present invention of course also covers a composite wherein the solder deposits or the link areas, or both, are arranged on both support substrates. It might also be advantageous if several solder shunting areas are provided for one soldering location with one or several link areas. However, the solder connections of the composite are not embodied as plug-through contacts.

Further advantages, as well as details of the composite in accordance with the present invention and its use ensue from the subsequent description of an exemplary embodiment by the attached drawings.

Shown are in:

DESCRIPTION OF THE PREFERRED EMBODIMENT(S) OF THE INVENTION

Figure 1:
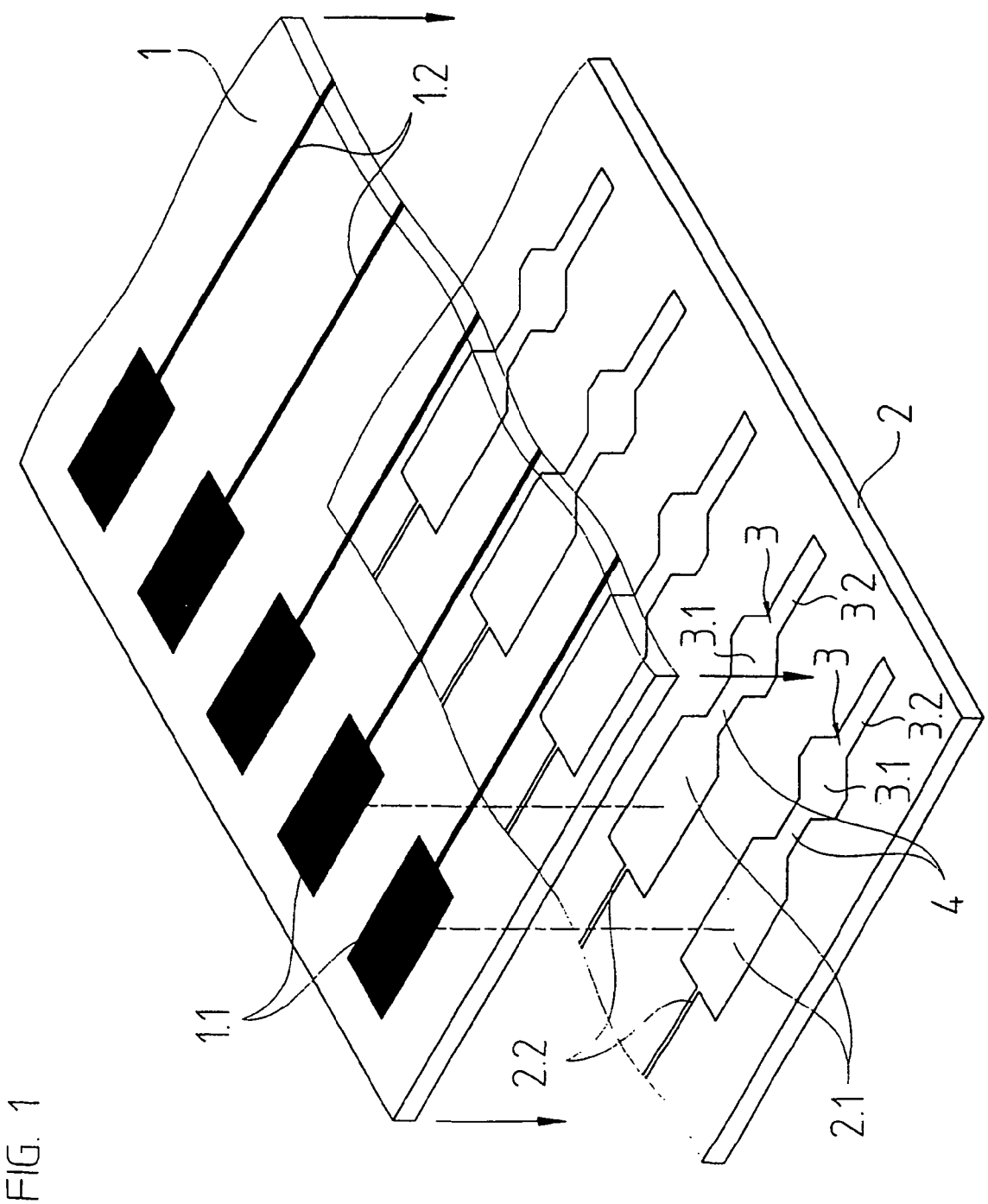
FIG. 1 shows an exploded view of an embodiment of a composite of a flexible strip conductor with a printed circuit board in accordance with the present invention.

A spatial representation of a composite is shown in FIG. 1 which, for the sake of clarity, is embodied in an exploded view. Solder pads 1.1 including a 15 μm to 20 μm thick copper layer are attached to the underside of an approximately 50 μm thick flexible strip conductor foil 1 made of polyimide. Moreover, strip conductors 1.2, also made of copper and having approximately the same layer thickness as the solder pads 1.1, are also located on this side of the strip conductor foil 1. Electrical signals are transmitted via the strip conductors 1.2 to an electronic element, not further represented.

A printed circuit board 2 made of glass is arranged opposite the strip conductor foil 1. Solder pads 2.1, strip conductors 2.2, solder shunting areas 3 and link areas 4 of copper of a layer thickness of approximately 3 μm are applied to the printed circuit board 2. If required, a coupling agent is provided on the printed circuit board 2 prior to applying the copper layer. The link areas 4 provide a connection to the solder shunting areas 3. Because the link areas 4 are narrower than the solder pads 2.1, and also narrower than the solder shunting areas 3, a retaining effect for the liquid solder being forced into the solder shunting areas 3 results if excess solder is present. In the example shown, the width of the link area 4 is approximately 40% of the width of the solder pad 2.1

The solder shunting areas 3 have a wider section 3.1 and a rectangular surface 3.2. The solder shunting area 3 is arranged in such a way that its wider section 3.1 and its rectangular surface 3.2 are located opposite the strip conductors 1.2 after the printed circuit board 2 and the strip conductor foil 1 have been joined in an exactly fitted way.

Figure 3:
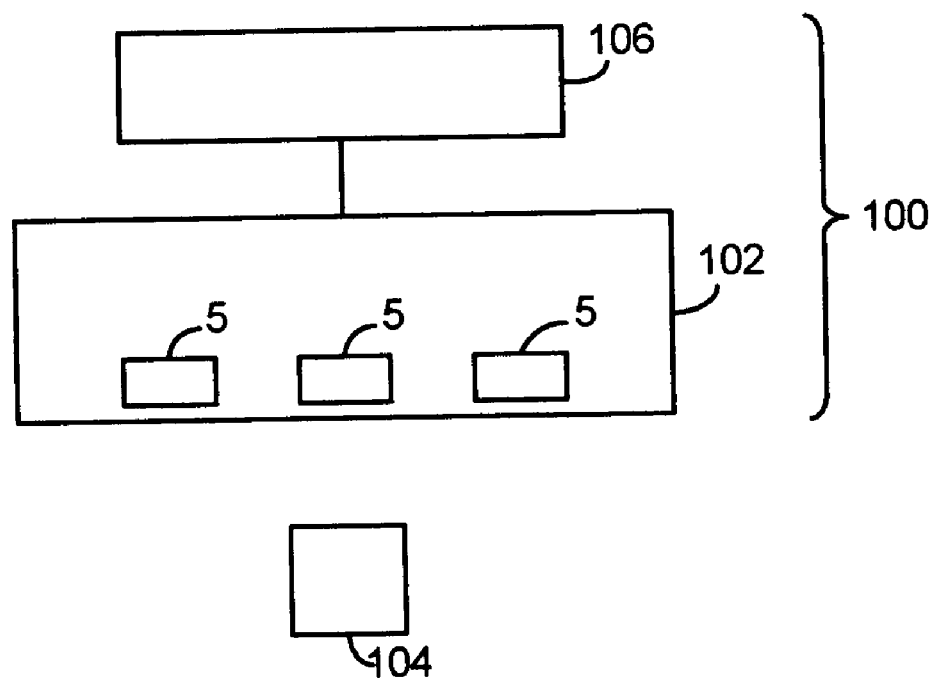
FIG. 3 schematically shows an embodiment of a position measuring system that includes an embodiment of a sensor element that employs the flexible strip conductor with a printed circuit board of FIGS. 1–2 in accordance with the present invention.

In this example, the strip conductors 2.2 lead to sensor structures 5 of a position measuring system 100, such as an angle encoder, which are not represented in FIG. 1. The position measuring system 100 is schematically represented in FIG. 3 so as to include a sensor system 102 that includes sensor structures/elements 5 that generate measurement signals representative of a position of an object 104 in a well known manner. The measurement signals are then sent to an electronic evaluation device 106 where a position is determined in a well known manner. Note that the blocks used in FIG. 3 are not to be interpreted to mean that the associated elements have a particular size or orientation with respect to one another.

Otherwise the present invention is not limited to link area geometries in which the link areas 4 have a rectangular shape. For example, the link areas 4 can also be embodied in such a way that their width is not constant over their length, so that a constriction, which is narrower than the solder pad 2.1, exists in one or several areas. Because of this the retaining effect is essentially caused by this constriction or constrictions. Moreover, arrangements are also covered by the present invention wherein a geometrically flowing transition between the individual partial elements of the conductor structure is provided. Thus, the link area 4 need not be absolutely offset from the solder shunting area 3, as long as a constriction permits the required retaining effect, it is to be considered a link area.

Prior to the smoothing solder method, a solder deposit, including a lead-tin mixture of a layer thickness of 10 μm to 20 μm is applied to the solder pads 1.1 of the strip conductor foil 1. Thereafter the printed circuit board 2 and the strip conductor foil 1 are placed exactly aligned on top of each other, so that the solder pads 1.1 and 2.1 come to rest opposite each other. Subsequently a hot soldering plunger is pressed on the strip conductor foil 1 with the result that the solder deposits between the strip conductor foil 1 and the printed circuit board 2 are heated and melt. In order to achieve an optimal effect of the solder shunting areas 3, they are also heated by the soldering plunger.

If the volume of the solder deposit was applied at the lower tolerance range, i.e. if the amount of solder is comparatively small, the solder will spread in the area of the solder pads 1.1, or 2.1. Because of its narrow width, the link area 4 exerts a certain retaining effect on the solder flow. In this way, with a small solder deposit the solder is kept in the contact area, so that it is optimally wetted, even under the above mentioned marginal condition, which leads to a good soldering result in the end.

In case the solder volume is of an actual volume which is greater than the desired value, the excess solder is being forced by the pressure of the soldering plunger into the solder shunting area 3 via the link area 4. When the excess solder is forced into the solder shunting area 3, a solder joint is formed that includes the solder pad 1.1, the link area 4 and the solder shunting area 3. Based on the wetting properties of the strip conductor foil 1 and the printed circuit board 2, the solder will not flow onto the strip conductor foil 1 or the printed circuit board 2 between the solder pads 1.1, or 2.1 as long as the link area 4 and the solder shunting area 3 can still accept solder. The surfaces of the link area 4 and the solder shunting area 3 are of such a size that the entire surplus solder, which might result within the predetermined solder deposit tolerances, is absorbed.

Figure 2:
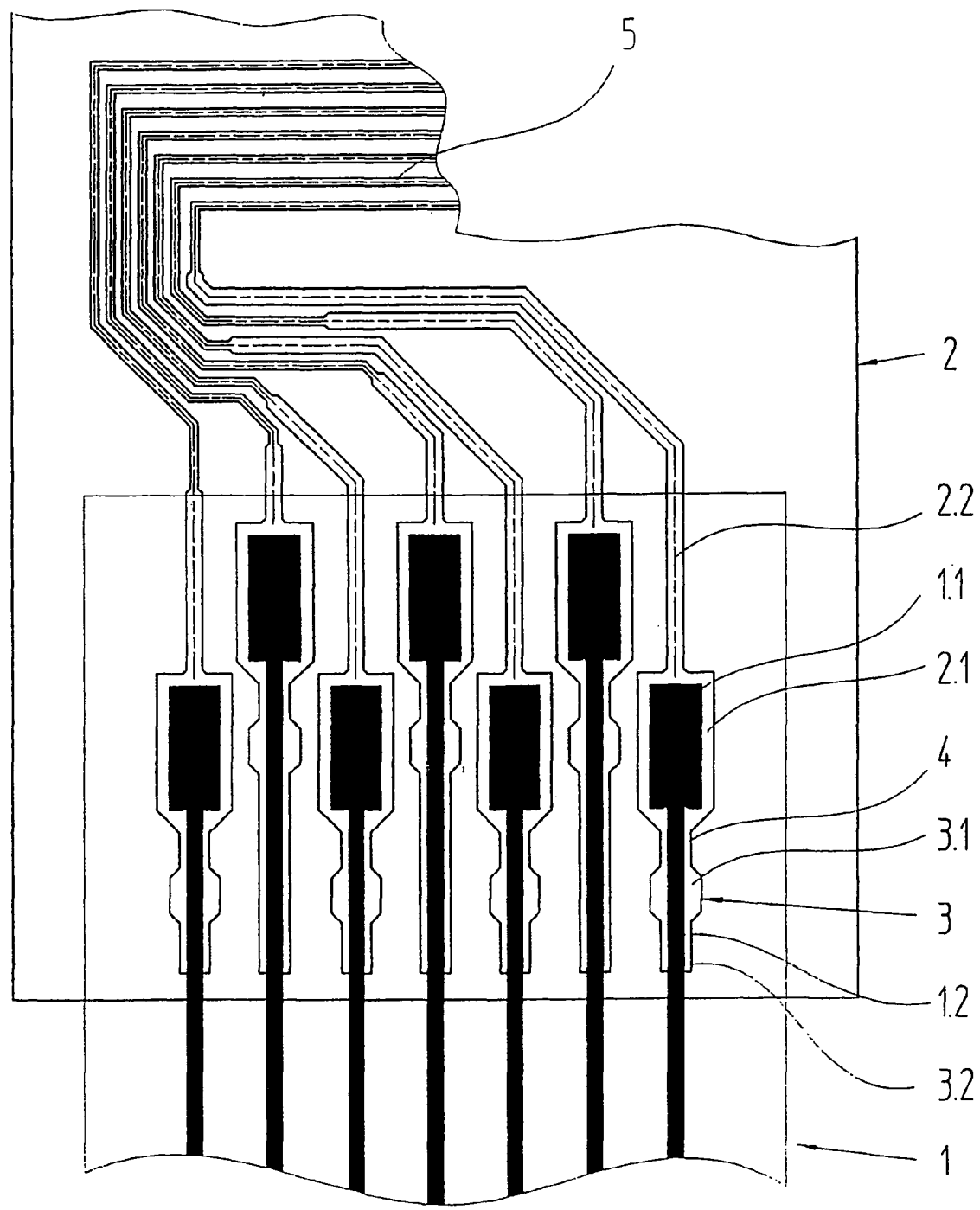
FIG. 2 shows a view from above on the composite of FIG. 1 through the flexible strip conductor foil, wherein the printed circuit board shown has, inter alia, sensor structures in accordance with the present invention.

A portion of a composite in accordance with the present invention is represented in FIG. 2 in the form of a view through the strip conductor foil 1. Sensor elements, such as magneto-resistive sensor structures 5, made of a nickel-iron alloy and of a type used with angle encoders or linear measuring devices, for example, have been applied to the printed circuit board 2. In these applications a relative position is determined by scanning magnetized graduated drums or scales.

In the exemplary embodiment represented, the strip conductors 1.2 have been arranged on the strip conductor foil 1 in such a way that, when the strip conductor foil 1 is correctly joined to the printed circuit board 2, the strip conductors 1.2 come to lie above the solder shunting areas 3 and the link areas 4. Thus, the strip conductors 1.2 extend in the same direction as the link areas 4 and the solder shunting areas 3 and, regarding their distance, furthermore are spaced apart in the same way as the link areas 4, or the solder shunting areas 3. This design has the advantage that the link area 4 and the solder shunting area 3 are in electrical contact with the strip conductor 1.2 outside the solder pads 1.1 and 1.2 when the solder flows off into the link area 4 and possible past it into the solder shunting area 3. The contact assurance is further increased in this way.

The strip conductors 1.2 on the flexible strip conductor foil 1 lead to an electronic evaluation device 106, not represented in FIG. 2 but shown in FIG. 3, at the other end of the strip conductor foil 1. The other end of the strip conductor foil not represented in FIG. 2 is brought into contact with a board of the electronic evaluation device 106 for processing the measurement signals. There, too, a composite in accordance with the present invention can be produced advantageously. Alternatively to the use of a soldered connection at that location, the electronic evaluation device can also be connected with the strip conductor foil 1 by a plug.

The present invention is of course not limited to the embodiment of the above represented example. Thus, if desired, three flat printed circuit boards or strip conductor foils can be soldered together, wherein one of these flat elements is arranged between the two others in the form of a sandwich. Accordingly, the invention may be embodied in other forms than those specifically disclosed herein without departing from its spirit or essential characteristics. The described embodiments are to be considered in all respects only as illustrative and not restrictive, and the scope of the invention is commensurate with the appended claims rather than the foregoing description.

We claim:

1. A composite of at least two flat elements, comprising:
a first support substrate comprising a first solder pad;
a second support substrate comprising a second solder pad that is soldered together with said first solder pad;
strip conductor structures applied to said first support substrate and said second support substrate; and
a link area that connects a solder shunting area with said first solder pad, wherein said link area is narrower than said first solder pad and said solder shunting area, wherein a soldering joint comprising said first solder pad, said link area and said solder shunting area, lies completely between said first support substrate and said second support substrate, wherein said solder shunting area is arranged in such a way that said solder shunting area is located opposite of one of said strip conductor structures.

2. The device in accordance claim 1, wherein said first support substrate is flexible.

3. The device in accordance with claim 1, wherein said first support substrate comprises a rigid plate.

4. The device in accordance with claim 1, wherein said solder shunting area is provided on said first support substrate and said solder shunting area has no solder deposited thereon prior to soldering.

5. The device in accordance with claim 1, wherein said first solder pad is larger than said second solder pad.

6. The device in accordance with claim 1, wherein said solder shunting area directly faces said one of said strip conductor structures.

7. The device in accordance with claim 3, wherein said rigid plate comprises a glass plate.

8. A sensor system, comprising:
a sensor element that generates a signal; and
a composite electrically connected to said sensor so as to receive said signal, said composite defining at least two flat elements and comprising:
a first support substrate comprising a first solder pad;
a second support substrate comprising a second solder pad that is soldered together with said first solder pad;
strip conductor structures applied to said first support substrate and said second support substrate; and
a link area that connects a solder shunting area with said first solder pad, wherein said link area is narrower than said first solder pad and said solder shunting area, wherein a soldering joint comprising said first solder pad, said link area and said solder shunting area, lies completely between said first support substrate and said second support substrate, wherein said solder shunting area is arranged in such a way that said solder shunting area is located opposite of and directly faces one of said strip conductor structures.

\* \* \* \* \*